United States Patent
Piccin

(10) Patent No.: US 12,300,610 B2
(45) Date of Patent: May 13, 2025

(54) METHOD AND APPARATUS FOR ELECTROMIGRATION REDUCTION

(71) Applicant: MACOM Technology Solutions Holdings, Inc., Lowell, MA (US)

(72) Inventor: Yohan Piccin, Mouans-Sartoux (FR)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 624 days.

(21) Appl. No.: 17/552,306

(22) Filed: Dec. 15, 2021

(65) Prior Publication Data

US 2023/0187354 A1 Jun. 15, 2023

(51) Int. Cl.
*H01L 23/52* (2006.01)
*H01L 23/522* (2006.01)
*H01L 23/528* (2006.01)

(52) U.S. Cl.
CPC ...... *H01L 23/5286* (2013.01); *H01L 23/5226* (2013.01)

(58) Field of Classification Search
CPC ............ H01L 23/5286; H01L 23/5226; H01L 23/482
USPC .......................................................... 257/94
See application file for complete search history.

(56) References Cited

U.S. PATENT DOCUMENTS

| | | | |
|---|---|---|---|
| 6,344,781 B1 | 2/2002 | Slenker | |
| 6,657,910 B2 * | 12/2003 | Kondou | H01L 23/5286 257/E23.153 |
| 6,754,407 B2 | 6/2004 | Chakravorty | |
| 7,191,424 B2 * | 3/2007 | Dirks | G06F 30/30 716/120 |
| 8,171,446 B2 * | 5/2012 | Inoue | H01L 23/5286 716/120 |
| 8,231,284 B2 | 7/2012 | Doany | |
| 9,064,981 B2 | 6/2015 | Laforce | |
| 9,069,924 B2 * | 6/2015 | Chen | G06F 30/39 |
| 10,074,570 B2 * | 9/2018 | Anderson | H01L 23/535 |
| 10,495,831 B2 | 12/2019 | Gupta | |
| 11,393,819 B2 * | 7/2022 | Li | H01L 23/5286 |
| 11,652,050 B2 * | 5/2023 | Schultz | H01L 27/092 257/369 |

(Continued)

FOREIGN PATENT DOCUMENTS

| | | |
|---|---|---|
| JP | 2005-209776 | 8/2005 |
| JP | 2008-227130 | 9/2008 |

*Primary Examiner* — Vu A Vu
(74) *Attorney, Agent, or Firm* — Jason H. Vick; AMPED IP LLC

(57) ABSTRACT

A semiconductor circuit configured to reduce electromigration. The circuit comprises a power rail and ground rail located on a first layer. A power finger and a ground finger are located on a second layer. Cells are located on the second layer, such that the one or more cells are electrically connected to a power finger and a ground finger. The circuit also includes one or more power vias electrically connecting the power rail to the power finger. The one or more power vias extend from the first layer to the second layer. One or more ground vias electrically connecting the ground rail to the ground finger, such that the one or more ground vias extend from the first layer to the second layer. The placement of the fingers on a different level than the rails establishing the fingers as non-contiguous sections thereby reducing electromigration and overcoming design analysis errors.

18 Claims, 4 Drawing Sheets

(56) References Cited

U.S. PATENT DOCUMENTS

| | | | |
|---|---|---|---|
| 11,836,432 B2 * | 12/2023 | Edathil | H01L 27/0207 |
| 2006/0034621 A1 | 2/2006 | Denoyer | |
| 2008/0017979 A1 * | 1/2008 | Chang | H01L 23/5286 |
| | | | 257/E21.582 |
| 2012/0182652 A1 * | 7/2012 | Jung | H01L 27/0255 |
| | | | 361/56 |
| 2015/0014775 A1 | 1/2015 | Seo et al. | |
| 2015/0248517 A1 | 9/2015 | Lu et al. | |
| 2019/0122987 A1 | 4/2019 | Chen et al. | |
| 2022/0302089 A1 * | 9/2022 | Rusu | H01L 24/80 |
| 2022/0336474 A1 * | 10/2022 | Liaw | H01L 29/0665 |
| 2023/0387181 A1 * | 11/2023 | Zou | H01L 23/3675 |

\* cited by examiner

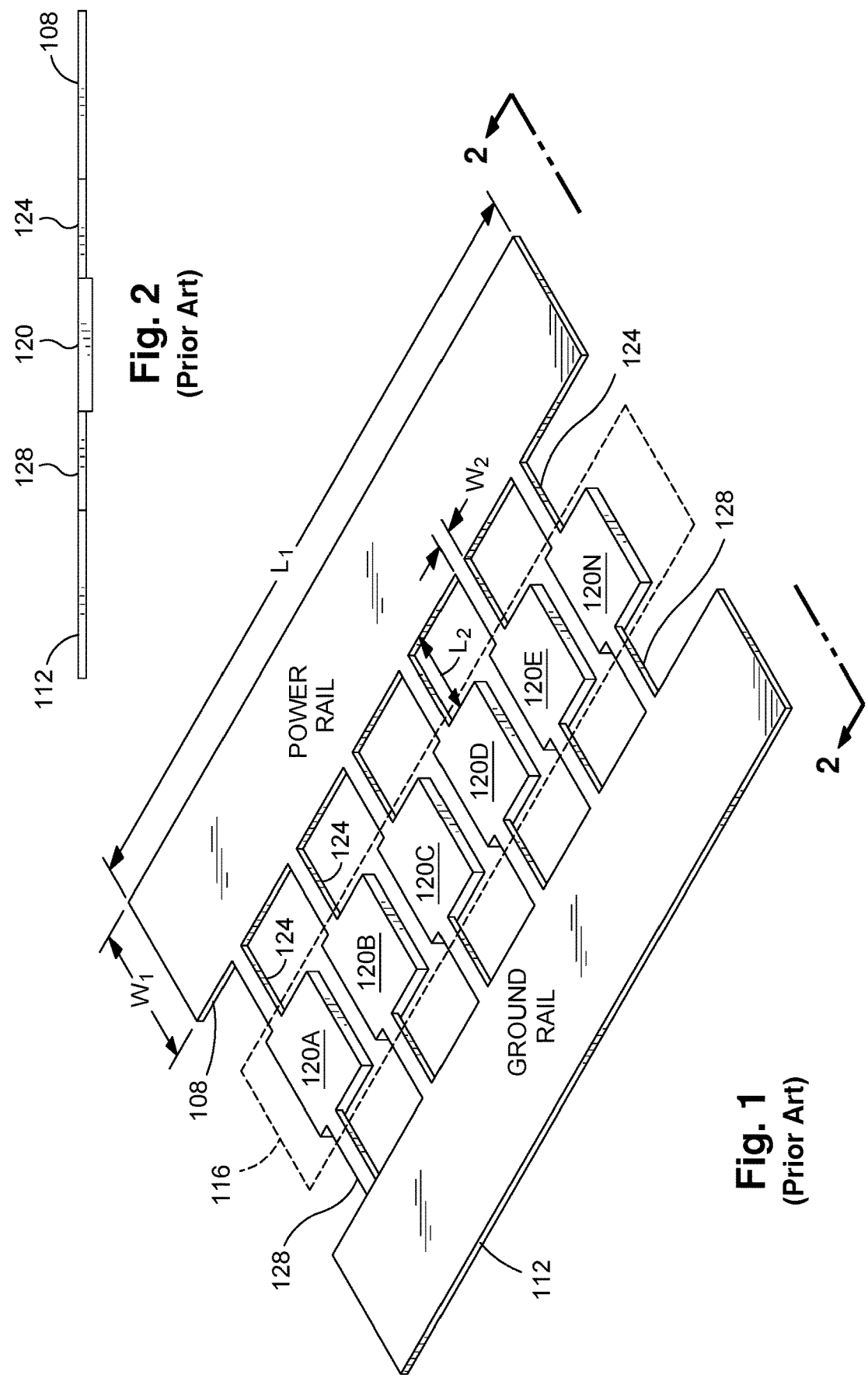

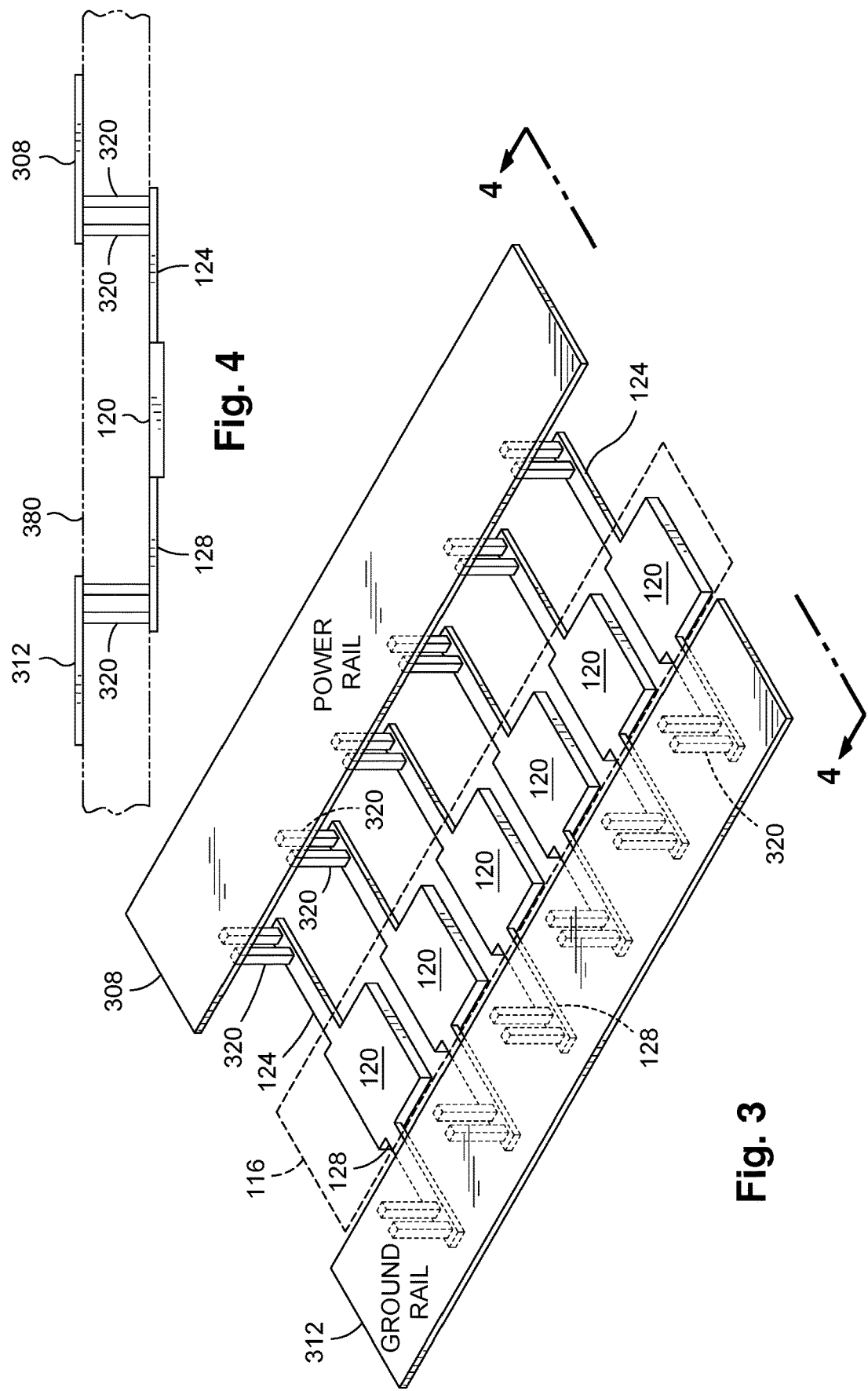

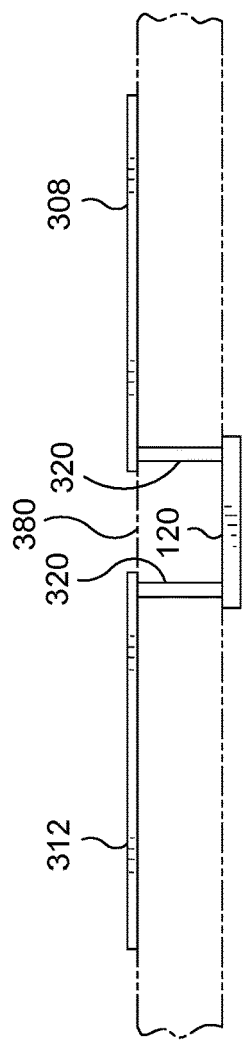
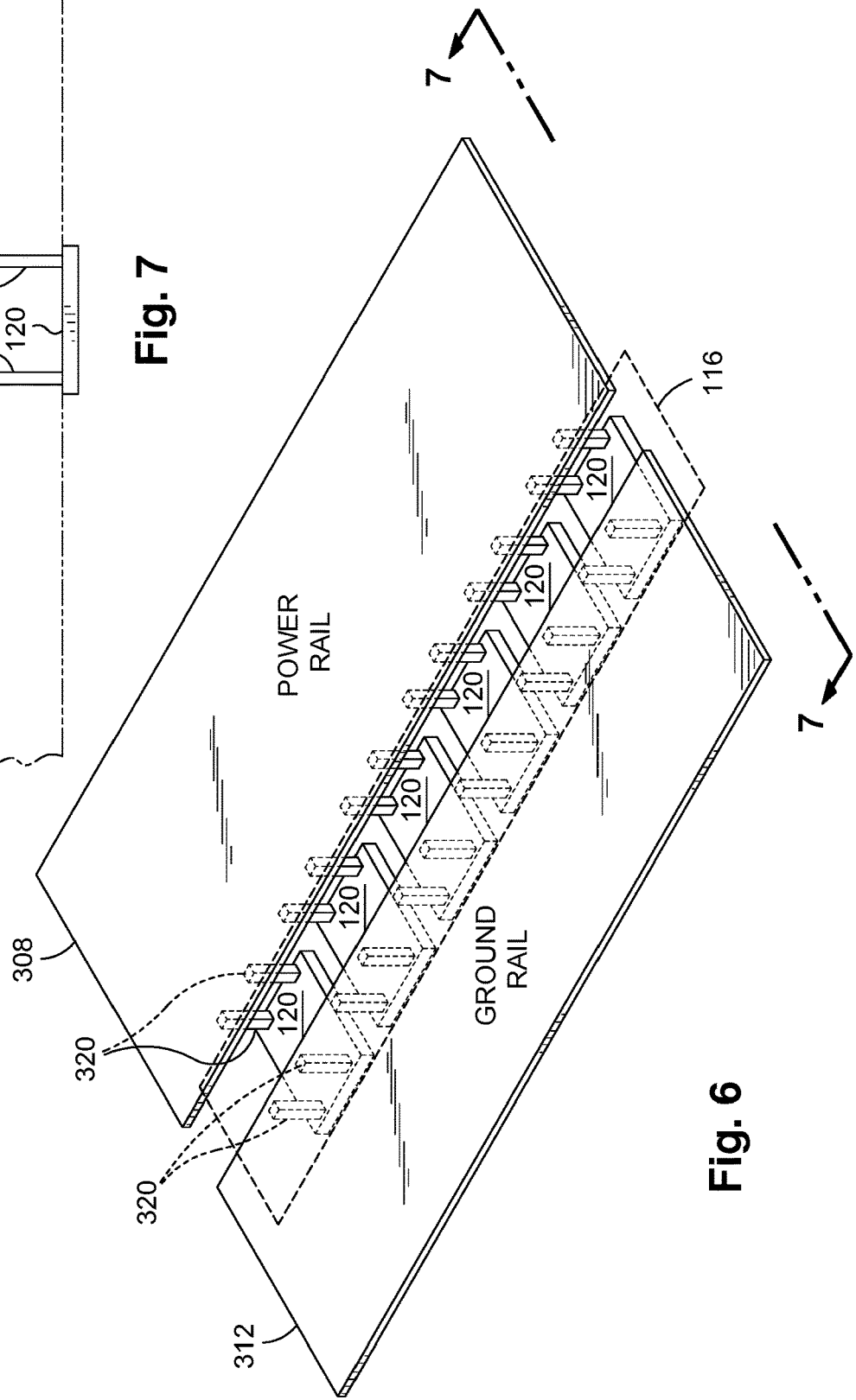
Fig. 7
Fig. 6

METHOD AND APPARATUS FOR ELECTROMIGRATION REDUCTION

1. FIELD OF INVENTION

The invention relates to electromigration reduction, and in particular to a method and apparatus for electromigration reduction.

2. RELATED ART

Electromigration is the movement of atoms based on the flow of current through a material. As the current density in a conductor increases, the heat dissipated within the material will repeatedly break atoms from the conductive structure and dislodge and move the atoms. Over time, this will result in a decrease of the reliability of chips and eventual loss of electrical connections and failure of a circuit.

During a design, it is intuitive to connect cells to a common power rail as illustrated in FIG. 1. FIG. 1 illustrates a top plan view of a cell-based circuit with power rail connections. In this example embodiment, two or more cells 120A, 120B, 120C, 120D, . . . 120N (where N is any whole number) are arranged into a circuit 116. Cells are pre-designed digital sub-circuits which are often stored in a software accessible library to be arranged into circuit.

Adjacent the cells 120 are a power rail 108 and a ground rail 112. Fingers 124 connect the cells 120 to the power rail 108 such that the fingers conduct power from the power rail to the cell to enable operation of the cells. Ground fingers 128 connect the cells 120 to the ground rail 112. Although shown as a power rail 108 and a ground rail 112, it is contemplated that these rails may be configured at any voltage level (positive or negative) or any power and ground configuration.

In the embodiment shown in FIG. 1, all the cells 120, rails 108, 112, and fingers 124, 128 are on the same level in the multi-layer semiconductor device. Establishing the power rail 108 and conductive fingers 124 at the same metal layer reduces manufacturing steps. FIG. 2 illustrates a plan side view of the circuit of FIG. 1. Identical elements in FIG. 2 are identified with identical reference numbers as compared to FIG. 1. As shown, a power rail 108 electrically connects to the finger 124 to supply power to the cells 120. The finger 124 is typically a source or drain of a MOS transistor. Similarly, the finger 128 connects the cell to ground 112. As clearly visible in the side plan view, the rails 108, 112, fingers 124, 128 and cells 120 are all on the same semiconductor layer. It is contemplated that additional layers, such as a substrate, insulation layers, and conductive layers are also present but are not shown to avoid confusion.

During the design phase the layout is analyzed to determine if the layout will violate any electromigration avoidance rules as established by the foundry or the design software. Fixing electromigration violation at or near the end of the design cycle always poses a high risk of delaying delivery schedules. Further, a layout re-design adds unwanted and non-value adding costs and the delay in product release will reduce profits and may harm customer relations. As a result, there is a need for a mechanism to fix electromigration weaknesses during the layout and design phase and/or follow a specific methodology which avoids any electromigration rule violations without degrading circuit performance.

SUMMARY

To overcome the drawbacks of the prior art and provide additional benefits, disclosed is a method and apparatus to reduce electromigration, thereby improving the design and fabrication process while also improving semiconductor reliability.

In one embodiment, a semiconductor circuit is disclosed which is configured to reduce electromigration. In one configuration the circuit comprises a power rail located on a first layer and a ground rail also located on the first layer. A power finger and a ground finger are located on a second layer. One or more cells are located on the second layer, such that the one or more cells are electrically connected to the power finger and the ground finger. The circuit also includes one or more power vias electrically connecting the power rail to the power finger such that the one or more power vias extending from the first layer to the second layer, and one or more ground vias electrically connecting the ground rail to the ground finger, such that the one or more ground vias extending from the first layer to the second layer.

In one embodiment, there are two power vias connected to each power finger and two ground vias connected to each ground finger. The arrangement includes two or more cells arranged to form a circuit. An insulating layer may be between the first layer and the second layer. It is contemplated that the number of power vias is based on current consumption of the cell. In this embodiment, the first layer is located above the second layer.

Also disclosed is a cell-based circuit comprising two or more cells arranged into a circuit. Each cell comprises a first finger extending from each cell such that the first finger on the same level as the cell. A second finger extends from each cell, such that the second voltage finger on the same level as the cell and the first finger. One or more first interconnects electrically connect to the first finger and one or more second interconnects electrically connect to the second finger. A first rail is provided on a different level than the cell, first finger, and second finger, such that the first rail is electrically connected to the one or more first interconnects. A second rail is provided on a different level than the cell, first finger, and second finger, such that the second rail is electrically connected to the one or more second interconnects.

In one embodiment, the first finger comprises a conductive trace sized to conduct current from the rail to the cell, and the second finger comprises a conductive trace sized to conduct current from the rail to the cell. In one configuration the first rail comprises a positive voltage rail and the second rail comprises a negative voltage rail. It is contemplated that the one or more first interconnects and the one or more second interconnects are one or more vias. In one embodiment, the first rail and the second rail are located at a higher level than the cell.

Also disclosed is a method for reducing electromigration in an electronic circuit power supply path. In one embodiment this method includes forming a circuit with an arrangement of cells on a first layer and forming and electrically connecting one or more power supply fingers to one or more of the cells, the one or more power supply finger on the first layer. This method also includes forming and electrically connecting one or more ground fingers to one or more of the cells such that, the one or more ground fingers are on the first layer. In addition, forming one or more insulating layers over the first layer, and forming one or more power supply vias in the one or more insulating layers. As a result, the one or more power supply vias electrically connecting to at least one power supply finger. This method forms one or more ground vias in the one or more insulating layer, the one or more ground vias electrically connecting to at least one ground finger. In this embodiment, the method also includes forming a power supply rail on the one or more insulating layers such that the power supply electrically connects to the one or more power supply vias and forming a ground rail on the one or more insulating layers, such that the ground rail electrically connects to the one or more ground vias.

In one embodiment, the arrangement of cells is interconnected. The ground rail may be at a negative voltage. In one configuration two vias electrically connect to each finger. In one embodiment, the first layer is closer to a substrate. The electromigration is reduced as a result of the power supply fingers being on a different layer than the power supply rail.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

FIG. 1 illustrates a top perspective view of a prior art cell-based circuit with power rail connections.

FIG. 2 illustrates a plan side view of the prior art layout of FIG. 1.

FIG. 3 illustrates a top perspective view of a cell-based circuit with power and ground rail connections based on the innovation disclosed herein.

FIG. 4 illustrates a plan side view of the layout of FIG. 3.

FIG. 6 illustrates a perspective view of an alternative embodiment.

FIG. 7 illustrates a plan side view of the alternative embodiment of FIG. 6.

DETAILED DESCRIPTION

Figure 5:
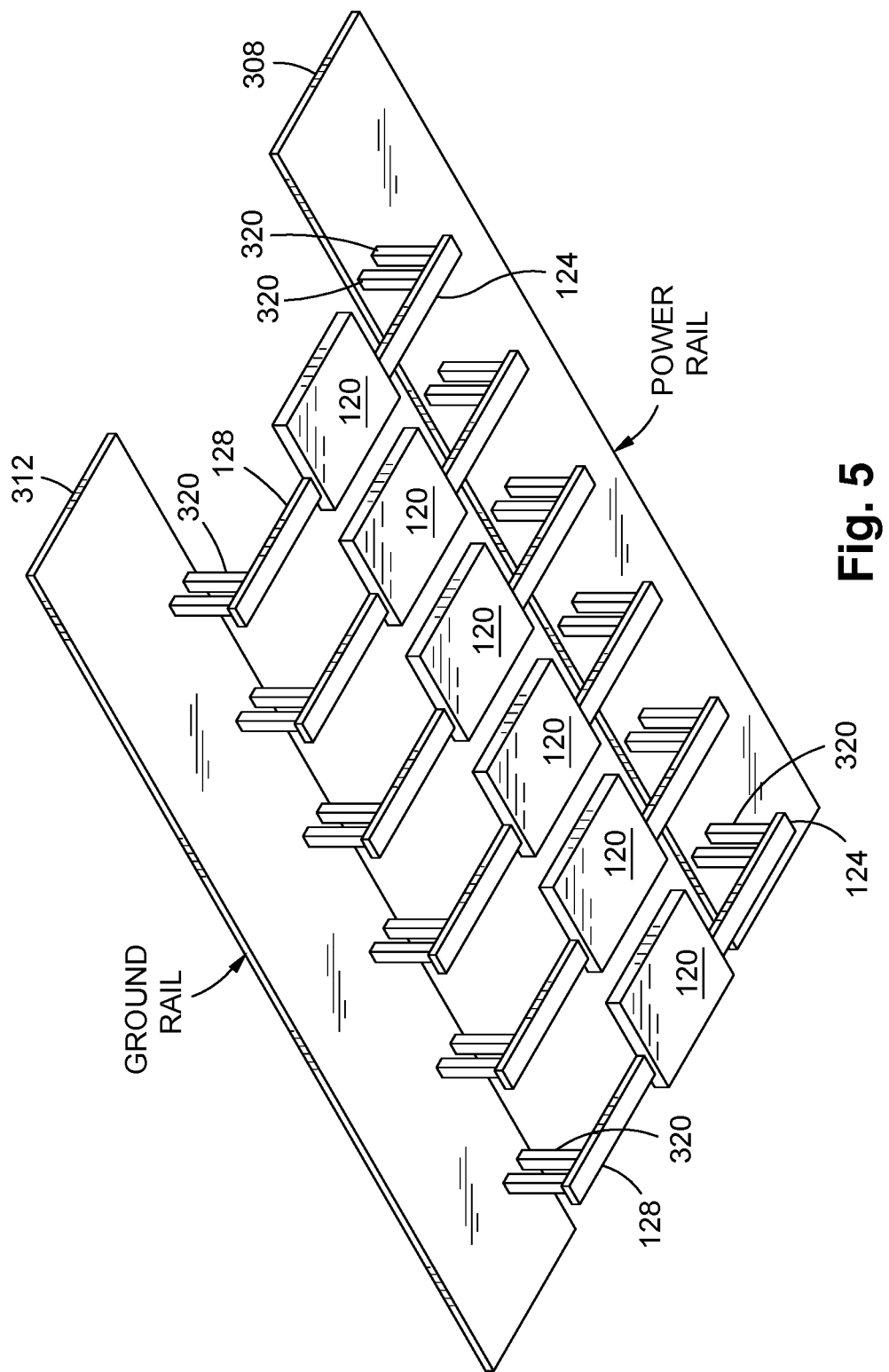
FIG. 5 illustrates a bottom perspective view of a cell-based circuit with power and ground rail connections based on the layout of FIG. 3.

Electromigration is dependent to a first order on the metal width and to a second order it's also sensitive to the area of the conductive path. For a fixed metal width, the longer the metal length is, the lower the current handling capability of the connection will be before being subject to electromigration. Based on research and experimentation, these properties are maintained for consecutive metal layers. For example, in prior art FIG. 1, the power rail 108 and the fingers 124 are one contiguous metallic surface on the same layer of the multi-layer semiconductor device. As a result, the length L and width W of the power rail 108 are considered as part of the finger 124 for an electromigration analysis. The electromigration evaluation considers the length and width of the power rail plus the sum of all the cells power connections (fingers) when formed as a contiguous structure on the same layer, as well as the current flowing through the power rail. The primary location of electromigration, where it to occur, would be in the fingers 124, 128.

To overcome the drawbacks of the prior art and provide additional benefits, disclosed is a semiconductor layout which places the power rail, the ground rail, or both (or any type positive or negative supply rail) on a different layer than the layer at which the cell is found. FIG. 3 illustrates a top perspective view of a cell-based circuit with power rail connections based on the innovation disclosed herein. This is but one possible embodiment and as such other layouts and configurations are possible and contemplated. Example types of cells include inverters, flip-flop, memory logic elements, gates, delay, latch, multiplexer, logic gates, or any other cell-based element. The cells are typically from a standard library of digital elements for elementary functions and are used to build up a circuit. Typically, cells are elements in the digital domain however the principles disclosed herein may also be implemented for analog circuits.

The embodiment of FIG. 3 includes a power rail 308 and a ground rail 312 which are located in the same plane, level or layer. Located at a different level, such as a lower level, are the fingers 128, 124 and the cells 120 that form the circuit. It is contemplated that interconnections between the cells may exist but are omitted in FIG. 3. Connecting the power rail 308 and the ground rail 312 to the fingers 124, 128 are vertically aligned conductors, such as vias 320. The vias 320 connect the cells 120 to the power rail 308 and to the ground rail 312 to enable operation of the cells. As discussed above, an assembly of cells 120 may be arranged to form a circuit.

In the embodiment of FIG. 3, the power rail 308 and ground rail 308 are located above the fingers 124, 128, and the cells 120, but it is contemplated that in other embodiments the physical relationship may be swapped with the power rail and ground rail being located below the cells and fingers. In some instances, the amount of current flowing in the power rail, which powers numerous cells, is too high to be placed on the more resistive lower layer. It is also contemplated and proposed that the rails 308, 312 and fingers 124, 128 may be in arrangements other than that shown in FIG. 3 which establish the fingers as other than a contiguous metal layer with the rails.

Although shown with two vias 320 connected to each finger 124, 128, in other embodiments a greater or fewer number of vias may be provided based on the current flow into each cell 120, as well as other factors. The vias may be round, square, rectangular, hollow, or solid or any other configuration suitable for electrically connecting the fingers to the rails. In addition, the scale, geometries, size, and size ratios between elements may all change.

FIG. 4 illustrates a plan side view of the layout of FIG. 3. In FIG. 3 the location of the elements on different layers of the multiple layer semiconductor device are easily visualized. The rails 308, 312 are located on a different level or layer than the fingers 124, 128. Interconnecting the rails 308, 312 and the fingers 124, 128 are the vias 320. It is contemplated that one or more layers may be located above the rails 308, 312 and one or more layers may be located below the fingers 124, 128 and cells 120. It is also disclosed that one or more layers may be located between the rails 308, 312, the fingers 124, 128, and cells 120. The various other layers may include conductive layers, insulating layers, substrate layers, a printed circuit board layer, packaging, semiconductor layers, or any other type of layer. For example, an insulating layer 380 is shown between the rails 312, 308 and the cell 120. The vias 320 extend through the insulating layer 380 to electrically connect the rail 312 to the finger 128 and the rail 308 to the finger 124. To avoid confusion in the drawing, the insulating layer is not shown in FIG. 3.

The distance between the rails 308, 312 and the fingers 124, 128 is exaggerated to make clear the different layer in which each element resides. Actual semiconductor devices may be constructed with different sizes, geometries and ratio relationships than shown in FIGS. 3 and 4.

FIG. 5 illustrates a bottom perspective view of a cell-based circuit with power and ground rail connections based on the layout of FIG. 3. As compared to FIGS. 3 and 4, identical elements are referenced with identical reference numbers. The bottom perspective view of FIG. 5 further illustrates the one or more vias 320 which connect the fingers 124, 128 to the rails 308, 312. The vias 320 are conductive and carry the power from the power rail 308 to the fingers 124, to the cells 120, and then from the cells to the fingers 128 and to the ground rail 312. The fingers 124 may be referred to as power fingers and the finger 128 may be referred to as ground fingers.

The configuration of locating the power rail and/or ground rail on different layers has several benefits. Electromigration will be evaluated by considering the length of the power rail plus the sum of all the cells' power connections (fingers). The evaluation will consider the cell power connection as one metal area and apply associated electromigration rules, which are restrictive based on the combined area of the power rail and the finger. The proposed solution to avoid this evaluation outcome places the rails on a different layer than the fingers (interconnected by a via or other structure). This separates the area of the rail from the area of the finger, thus avoiding an evaluation outcome that would yield a design error for a design with likely electromigration. It is also contemplated and possible to merge cells to make the realization of the layer faster.

It is also contemplated that the elements described herein may both be power rails, such as one rail established at a voltage Vdd and the other rail established at a voltage Vss. Further, although shown with two rails, it is contemplated that more than two rails may be used or a single rail may be used.

FIG. 6 and FIG. 7 illustrates an alternative embodiment of the innovation. As shown in FIGS. 6 and 7, the fingers are not present and instead the power rail 308 and the ground rail 312 extend over the cells 120 as shown. The vias 320 directly connect the cell 120 and extend upward (or downward) to directly connect to the rail 308, 312. This avoids use of the fingers and connects the rails 308, 312 directly to the cells 120 through the vias 320. As shown in FIG. 4, an insulating layer (not shown in FIG. 7) is typically between the rails 308, 312 and the cells 120. This embodiment does not require use of the fingers thereby reducing required elements and allowing for a more compact structure, while still gaining the benefits of the embodiment shown in FIGS. 3 and 4. In this embodiment and other embodiments, the power rail 308 and ground rail 312 may be located above or below the cells 120. In addition, it is contemplated that in one embodiment the arrangement may be a hybrid configuration that includes one or more vias directly connected between a rail and a cell and also fingers extending from the cell which provides for connection of a one or more vias to the finger and the rails.

While various embodiments of the invention have been described, it will be apparent to those of ordinary skill in the art that many more embodiments and implementations are possible that are within the scope of this invention. In addition, the various features, elements, and embodiments described herein may be claimed or combined in any combination or arrangement.

What is claimed is:

1. A semiconductor circuit configured to reduce electromigration comprising:
   a power rail located on a first layer;
   a ground rail located on the first layer;
   a power finger located on a second layer;
   a ground finger located on the second layer;
   a cell located on the second layer, the cell electrically connected to the power finger and the ground finger, such that the cell receives power through the power finger;
   one or more power vias physically and electrically connecting the power rail to the power finger, the one or more power vias extending from the first layer to the second layer to thereby connect the power rail to the power finger; and
   one or more ground vias physically and electrically connecting the ground rail to the ground finger, the one or more ground vias extending from the first layer to the second layer to thereby connect the ground rail to the ground finger.

2. The circuit of claim 1 wherein there are two power vias connected to each power finger and two ground vias connected to each ground finger.

3. The circuit of claim 1 wherein the arrangement includes two or more cells arranged to form a circuit.

4. The circuit of claim 1 wherein an insulating layer is between the first layer and the second layer.

5. The circuit of claim 1 wherein a number of one or more power vias is based on current consumption of the cell.

6. The circuit of claim 1 wherein the first layer is located above the second layer.

7. A cell-based circuit with reduced electromigration comprising:
   two or more cells arranged into a circuit, each cell comprising:
      a first finger extending from each cell, the first finger on the same level as the cell;
      a second finger extending from each cell, the second voltage finger on the same level as the cell and the first finger;
      one or more first interconnects physically and electrically connected to the first finger;
      one or more second interconnects physically and electrically connected to the second finger;
   a first rail on a different level than the cell, first finger, and second finger, the first rail electrically connected to the one or more first interconnects; and
   a second rail on a different level than the cell, first finger, and second finger, the second rail electrically connected to the one or more second interconnects.

8. The circuit of claim 7 wherein the first finger and second finger each comprise a conductive trace sized to conduct current from the rail to the cell.

9. The circuit of claim 7 wherein electromigration is reduced due to the first finger being on a different level than the first rail.

10. The circuit of claim 7 wherein the first rail comprises a positive voltage rail.

11. The circuit of claim 7 wherein the second rail comprises a negative voltage rail.

12. The circuit of claim 7 wherein the one or more first interconnects and the one or more second interconnects are one or more vias.

13. The circuit of claim 7 wherein the first rail and the second rail are located at a higher level than the cell.

14. A method for reducing electromigration in an electronic circuit power supply path comprising:
   forming a circuit with an arrangement of cells on a first layer;

forming and electrically connecting one or more power supply fingers to one or more of the cells, the one or more power supply finger on the first layer;

forming and electrically connecting one or more ground fingers to one or more of the cells, the one or more ground fingers on the first layer;

forming one or more insulating layers over the first layer;

forming one or more power supply vias in the one or more insulating layers, the one or more power supply vias physically and electrically connecting to at least one power supply finger;

forming one or more ground vias in the one or more insulating layers, the one or more ground vias physically and electrically connecting to at least one ground finger;

forming a power supply rail on the one or more insulating layers, the power supply electrically connected to the one or more power supply vias, wherein locating the power supply rail on a different layer than the one or more power supply fingers reduces electromigration; and forming a ground rail on the one or more insulating layers, the ground rail electrically connected to the one or more ground vias.

15. The method of claim 14 wherein the arrangement of cells is interconnected.

16. The method of claim 14 wherein the ground rail is at a negative voltage.

17. The method of claim 14 wherein the two vias electrically connect to each finger.

18. The method of claim 14 wherein the first layer is closer to a substrate.

* * * * *